(12) United States Patent
Nguyen et al.

(10) Patent No.: US 6,853,584 B2
(45) Date of Patent: Feb. 8, 2005

(54) CIRCUIT FOR COMPENSATING PROGRAMMING CURRENT REQUIRED, DEPENDING UPON PROGRAMMING STATE

(75) Inventors: Hung Q. Nguyen, Fremont, CA (US); Sang Thanh Nguyen, Union City, CA (US); Elbert Lin, Fremont, CA (US); Anh Ly, San Jose, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/428,742

(22) Filed: May 2, 2003

(65) Prior Publication Data
US 2004/0218422 A1 Nov. 4, 2004

(51) Int. Cl.[7] .............................................. G11C 16/06
(52) U.S. Cl. .................... 365/185.21; 365/226
(58) Field of Search ........................... 365/185.21, 226, 365/185.01

(56) References Cited
U.S. PATENT DOCUMENTS 6,163,483 A * 12/2000 Pasotti et al. ............ 365/185.19
6,518,909 B1 * 2/2003 Yang et al. .................. 341/155

* cited by examiner

Primary Examiner—Thong Q. Le
(74) Attorney, Agent, or Firm—Gray Cary Ware & Freidenrich LLP

(57) ABSTRACT

A non-volatile memory semiconductor device has a circuit to compensate for the variation in the data pattern to be programmed. The variation in the data patter creates a variation in the current requirement. The array receives a plurality of data pattern signals which affect the total amount of current flowing into a plurality of columns and into the memory array. A high voltage source generates an output which is supplied along a conducting path connected to the group of columns. A pass transistor is in the conducting path controlling the current flow in the conducting path. A current source has a first terminal and a second terminal with the first terminal connected to the output of the high voltage generator and the second terminal connected to the gate of the pass transistor. A plurality of current sources are collectively connected to a node. Each of the plurality of current sources receives a plurality of second signals with each second signal being an inverse of the first signal, and controlling the total amount of current flowing through the node. A current mirror circuit is connected to the node and to the gate of the pass transistor and controls the pass transistor in response to the amount of current flowing through the node.

12 Claims, 2 Drawing Sheets

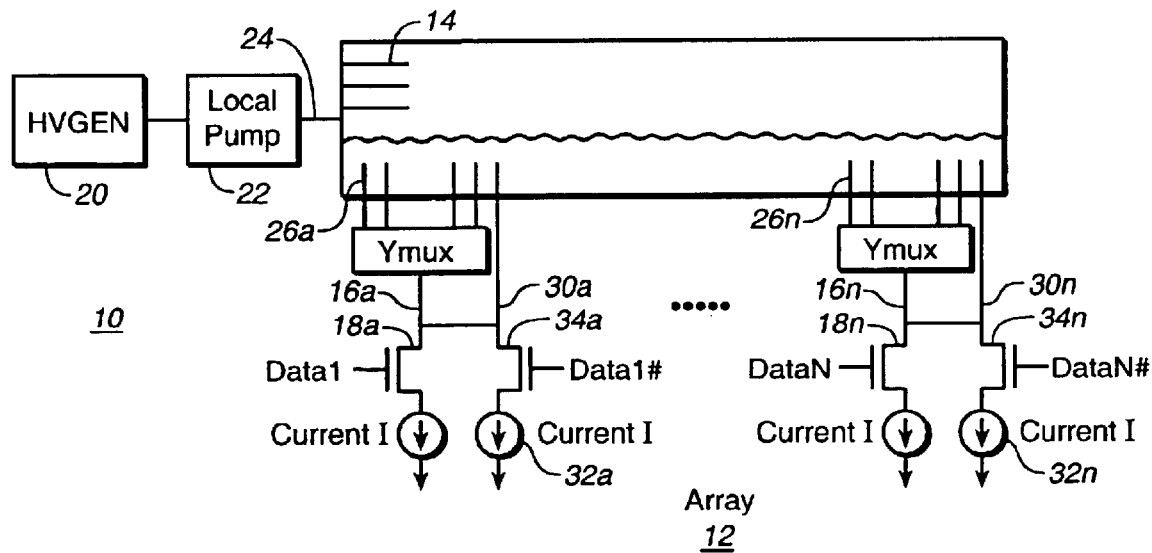
FIG._1
*(PRIOR ART)*
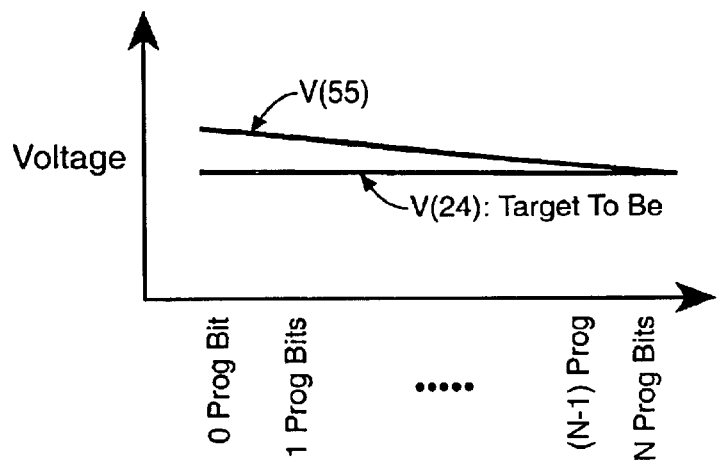
FIG._3

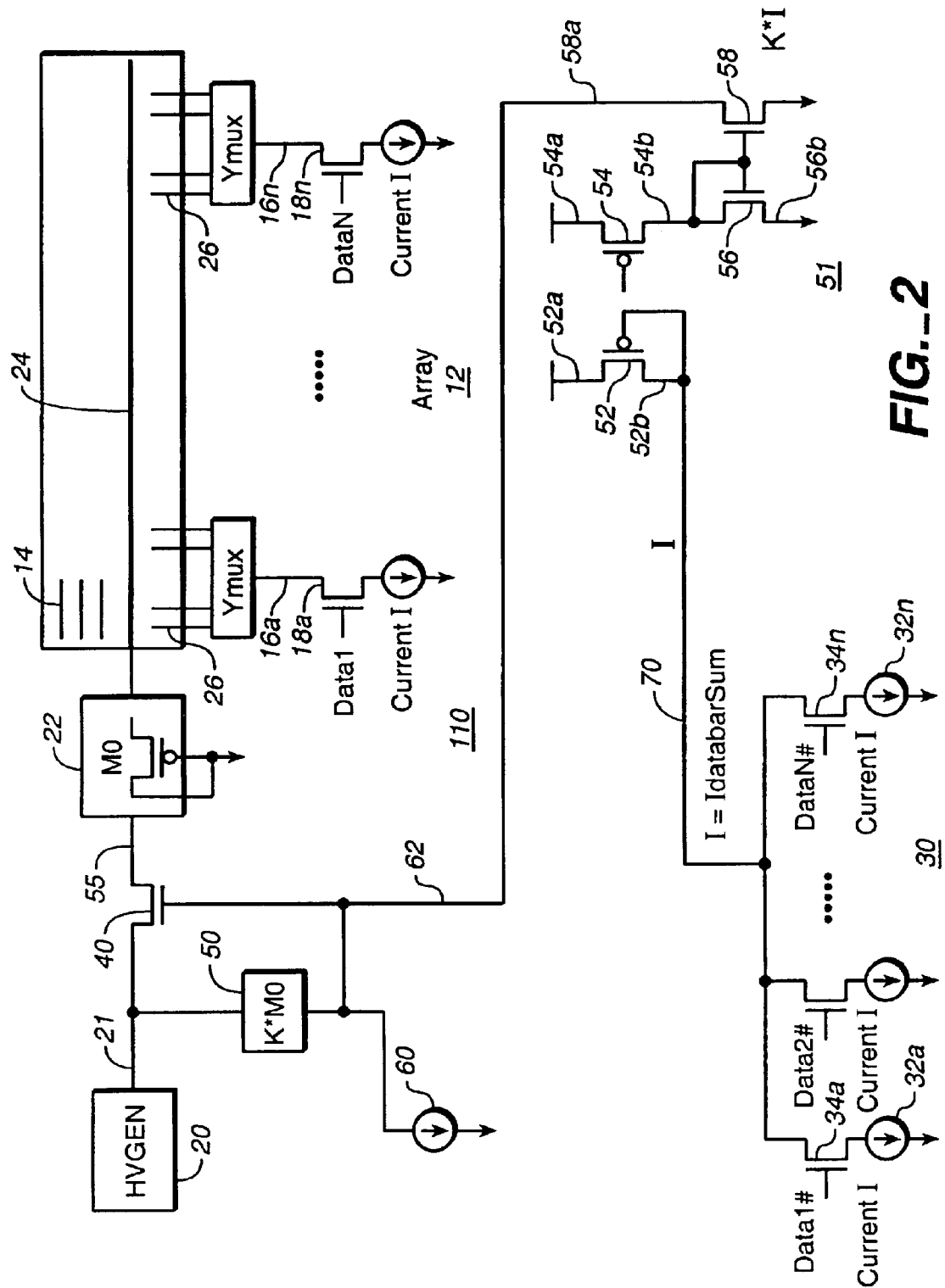
FIG._2

US 6,853,584 B2

1

CIRCUIT FOR COMPENSATING PROGRAMMING CURRENT REQUIRED, DEPENDING UPON PROGRAMMING STATE

TECHNICAL FIELD

The present invention relates to a circuit that controls and regulates the current consumption for a memory device during the programming mode when the current remains relatively constant irrespective of the data to be programmed. More particularly, the present invention relates to a high voltage generating current compensating circuit for use in a non-volatile memory circuit array.

BACKGROUND OF THE INVENTION

Semiconductor memory devices having an array of non-volatile memory cells are well known in the art. Referring to FIG. 1, there is shown a semiconductor memory device 10 of the prior art. The device 10 comprises a memory array 12 of non-volatile memory cells arranged in a plurality of rows and columns. Each of the memory cells can be a split gate floating gate memory cell or a stacked gate floating gate non-volatile memory cell. A plurality of rows 14 and a plurality of columns 16 access the array of cells in the memory array 12. A high voltage generator 20 generates a high voltage which is used during the programming of one or more of the cells in the non-volatile memory array 12. The high voltage is supplied to a local pump 22 which comprises a PMOS transistor having a first terminal, a second terminal with a channel therebetween and a gate for controlling the conduction of the current from the first terminal to the second terminal. The gate of the transistor 22 is connected to a first terminal which receives the voltage from the high voltage generator 20. The local pump 22 has its second terminal connected to a source line 24. The source line 24 has resistance along the length thereof. As the line 24 extends further from the pump 22, the resistance increases. From the source line 24, a plurality of column access lines 26A–26N are connected to the plurality of column lines 16 which access the memory cells in the memory array 12. The device 10 also comprises a plurality of dummy column lines 30A–30N connected to the source line 24. The function of the dummy column lines 30(A–N) will be discussed hereinafter. Each of the column lines 16 has a MOS transistor 18 having a gate controlled by an input signal Data_i. Thus, the state of the voltage supplied to the gate of the MOS transistor 18, which is the state of the signal Data_i, determines whether the column line 16 connects the memory array 12 to the source line 24. Each of the MOS transistors connects the column line to a memory cell, which is a current source, where the amount of current flow differs depending upon the state to which the memory cell is programmed. Each of the dummy column lines 30(A–N) comprises a first MOS transistor 34A whose gate is supplied with the inverse of the data signal supplied to the column line 16, and a second MOS transistor 32A whose gate is connected to voltage source thereby acting as a current source.

In the operation of the memory device 10, during the programming mode, data that is desired to be programmed into the memory array 12 to selected cells, is supplied to the MOS transistors 18 to selectively turn on the selected column line 16 to connect the memory array 12 to the source line 24 and ultimately to the high voltage from the high voltage generator 20. The problem, however, is that the data pattern supplied to the gate of the transistors 18 cannot be predicted.

2

Thus, for a data pattern where Data_1=1, turning on the transistor 18A, and all the rest of the data signals Data_2 ... Data_n–1 being turned off (equal 0) and Data_n=1, the current to the column 16N would be different than if the data pattern were Data_1=0, Data_2=0, Data_n–1=1, Data_n=1. This is because as previously stated, the source line 24 has resistance and as the column line 16 is located further away from the high voltage generator 20, more resistance is encountered, even though the same number of column lines 16 are turned on. Thus, the current supplied to the column line 16N for the memory cell furthest away from the high voltage generator 20 is different for the two cases, even although the two data patterns are the same in terms of the total amount of current lines being turned on. Furthermore, the data patterns may change. The total amount of current necessary to program the case where Data_1=1, Data_2=1, ... Data_n=1 is very different from the case where the data pattern is Data_1=0, Data_2=0, ... Data_n=0. The inconsistency between the current requirements between these two conditions further causes variations in the current load requirements on the high voltage generator 20.

In an effort to compensate for the difference in the data pattern as well as for the resistance in the source line 24, the dummy column lines 30A–30N are provided. Because the data pattern supplied to these dummy column lines is always the inverse of the data pattern supplied to the column line 16A–N, the total amount of current flowing through the source line 24 is the same irrespective of the actual data pattern supplied to the signals Data_1 ... Data_n. In addition, because the current required during programming on the entire source line 24 is a constant, the resistance due to the source line 24 can be taken into account by the behavior of the MOS transistors in the column 16N furthest away from the high voltage generator 20.

Although the foregoing technique of compensating for the current requirements for different data patterns is satisfactory, as the scale of integration increases, because the pitch is reduced, the distance between column lines 16 to insert the dummy column lines 30 becomes increasingly difficult. Further, voltage drop could also increase because the pitch is smaller.

Therefore, it is desired to have a circuit and technique whereby the benefits of a constant data independent current limiting circuit can be implemented in a non-volatile memory array device.

SUMMARY OF THE INVENTION

Accordingly, in the present invention, a semiconductor memory device comprises a memory array which has a plurality of rows and columns for receiving a plurality of first signals. The plurality of first signals affect the total amount of current flowing through a first group of the columns. A voltage source has an output. A conducting path connects the output to the first group of the columns. A transistor in the conducting path controls the current flow in the conducting path with the transistor having a control terminal. A current source has a first terminal and a second terminal with the first terminal connected to the output of the voltage source and the second terminal connected to the control terminal of the transistor. A first plurality of current sources are collectively connected to a node. The plurality of current sources receive a plurality of second signals with each of the second signals being an inverse of the first signal. The plurality of second signals affect the total amount of current flowing through the node. A current mirror circuit has a first terminal and a second terminal with the first terminal connected to the node and the second terminal connected to the control terminal.

BRIEF DESCRIPTION OF THE DRAWINGS

FIG. 1 is a circuit diagram of a semiconductor memory device of the prior art.

FIG. 2 is a circuit diagram of a semiconductor memory device of the present invention having an improved circuit to compensate for current requirements of different data patterns.

FIG. 3 is a diagram of the voltage at various nodes in the circuit of the present invention shown in FIG. 2, as a function of the number of bits to be programmed.

DETAILED DESCRIPTION OF THE INVENTION

Referring to FIG. 2, there is shown a circuit diagram of an improved semiconductor memory device 110 of the present invention. Because the device 110 incorporates many of the same components as that shown in the device 10 of the prior art in FIG. 1, the same numeral designation will be used. The device 110 is typically an integrated circuit semiconductor memory device and comprises a high voltage generator 20 supplying an output 21. A NMOS pass transistor 40 is between the output 21 and the local pump 22. The NMOS 40 transistor has a first terminal, a second terminal with a channel therebetween and a gate for controlling the conduction of charges between the first terminal and the second terminal. The first terminal of the NMOS transistor 40 is connected to the output 21. The second terminal of the NMOS transistor 40 is connected to the local pump 22 at terminal 55. The local pump 22 comprises a PMOS transistor device having a first terminal, a second terminal and a gate, with the gate connected to the first terminal, which is the same as the prior art shown in FIG. 1. The first terminal of the PMOS transistor 22 is connected to terminal 55. The second terminal of the PMOS transistor 22 is connected to a source line 24. The source line 24 is connected to a plurality of column access lines 26(A–N) which are supplied to a plurality of column lines 16(A–N). The plurality of column lines 16(A–N) are supplied to a memory array 12 of non-volatile memory cells. A plurality of row lines 14 are also supplied to the memory array 12. The memory array 12 comprises a plurality of non-volatile memory cells using floating gate to store charges thereon, such as a split gate floating gate non-volatile memory cell or a stacked gate floating gate non-volatile memory cell.

Within each of the column lines 16A is a transistor 18 interposed between the column line 16 and the memory array 12. A data signal Data_1, or Data_2 . . . or Data_n is supplied to each of the switch transistors 18 at its gate thereof. The voltage of the data signal Data_i determines whether the memory array 12 is connected to the source line 24. Thus far, with the exception of the NMOS transistor 40, all of the components described heretofore are shown and found and described in FIG. 1 of the device 10 of the prior art.

The improved memory device 110 also comprises a current source 50. The current source 50 has three terminals. In one embodiment, the current source can be another PMOS transistor having a gate, a first terminal and a second terminal, with the first terminal connected to node 21. The gate and the second terminal of the current source 50 are connected together with the second terminal supplied to the gate of the pass transistor 40 at node 62. The second terminal of the current source 50 is also connected to a bias current source 60 and a current mirror circuit at node 62.

The function of the current source 50 is to compensate what is lost across current source 22. Thus, when more current flows through source 22, then less current flows through source 50, and vice versa. However, current sources 50 and 22 have different bias conditions. Current source 50 is a higher source follower transistor than current source 22. In addition, it has an additional bias caused by the presence of the current source 60, which is a small bias intended to keep the circuit running in case the current mirror circuit 51 is off.

A current mirror circuit 51 is connected to the node 62. The current mirror circuit 51 has two branches. In a first branch a PMOS transistor 52 has its first terminal 52A connected to a voltage source and the second terminal 52B connected to a current source 30, producing current I. The gate of the PMOS transistor 52 is connected to the second terminal 52B, which is connected to the current source 30. In the second branch of the current mirror circuit 51, a second PMOS transistor 54 has its first terminal 54A connected to the voltage source. The second PMOS transistor 54 has a second terminal 54B. The second PMOS transistor 54 has its gate connected to the gate of the first PMOS transistor 52. In the second branch of the current mirror circuit 50, a first NMOS transistor has a first terminal connected to its gate and to the second terminal 54B of the second PMOS transistor 54. The second terminal 56B of the first NMOS transistor 56 is connected to ground. Finally, a second NMOS transistor 58 has a gate connected to the gate of the first NMOS transistor 56. The first terminal 58A of the second NMOS transistor 58 is connected to node 62. The second terminal 58B of the second NMOS transistor 58 is connected to ground, while its gate is connected to the gate of the NMOS transistor 56. The current flowing through the second NMOS transistor 58 is K*I, where I is the amount of current flow through the current source 30, while K is a constant, discussed hereinafter.

The current source 30 comprises a node 70 connected to the second terminal 52B of the PMOS transistor 52. The node 70 is connected to a plurality of lines each of which has a pass transistors 34 connected with each of the pass transistors 34 receiving an inverse of the data signal supplied to the column lines 16. Each of the pass transistor 34 is connected to a current source 32. The collective current sources 32(A–N) are connected in common to ground. Thus, the amount of current I flowing through node 70 is the total amount of current from all the current sources 32 that are "on" by its respective data# being on.

The theory of operation of the device 110 of the present invention is as follows. Assume that the data pattern storage in the memory array 12 is 0000 . . . 0 where Data_1=0, Data_2=0 . . . Data_n=0. Thus, the amount of current flow through the column lines 16 into the memory array 12 is minimal. This means that the inverse data pattern as supplied to the lines 34(A–N) would be 1111 . . . 1 and would be high. This turns on each of the transistors 34(A–N) and a large amount of current I would flow through the node 70 to ground. This would cause the amount of current (K*I) flowing through second NMOS transistor 58 to be high. Therefore, the amount of current supplying on the line 62 to the gate of the pass transistor 40 is large. This would cause a large amount of current to flow through the current source 50, which would decrease the amount of current flow through the local pump 22. This would be consistent with the required amount of current as determined by the data pattern of 0000 . . . 0.

In the other case, if the data pattern to be programmed is 1111 . . . 1 or where Data_1=1, Data_2=1 . . . Data_n=1 then the maximum amount of current will flow through the column lines 16(A–N) into the memory array 12. Thus, the pump 22 must supply the maximum amount of current. However, in that event, the inverse of the data signals supplied to each of the transistors 34(A–N) would be zero or turning off those transistors 34. Thus, little if any current I will flow through the node 70. Thus, the current flow (K*I) through second NMOS transistor 58 would also be low. This would cause little current to flow through the current source 50, which would cause more current to flow through the local pump 22, and to the source line 24. To further decrease resistance in the source line 24, it can be strapped by a metal line.

The factor K which is the multiplier of current in the current mirror circuit 51 is introduced to provide some flexibility of the total compensation. Typically, however, K can be "1".

Referring to FIG. 3 there is shown a simulated diagram of voltage versus number of programming bits for the circuit 110 of the present invention. The voltage for node 24 is shown. In addition, the voltage at node 55 is also shown.

What is claimed is:

1. A semiconductor memory device comprising:
    a memory array having a plurality of rows and columns for receiving a plurality of first signals, said plurality of first signals affecting the total amount of current flowing through a first group of said columns;
    a voltage source having an output;
    a conducting path connecting said output to said first group of said columns;
    a transistor in said conducting path, for controlling the current flow in said conducting path; said transistor having a control terminal;
    a current source having a first terminal and a second terminal, with said first terminal connected to said output, and said second terminal connected to said control terminal;
    a first plurality of current sources collectively connected to a node; said first plurality of current sources for receiving a plurality of second signals, each of said second signal being an inverse of said first signal, said plurality of second signals affecting the total amount of current flowing through said first plurality of current sources at said node; and
    a current mirror circuit having a first branch connected to said node, and a second branch mirroring current flowing in said first branch, with said second branch connected to said control terminal.

2. The device of claim 1 wherein said current mirror circuit comprises:
    said first branch comprising:
        a first PMOS transistor having a first terminal and a second terminal with a channel therebetween, and a gate for controlling the conduction of charges in said channel; said first terminal connected to a first voltage source, said second terminal connected to said gate and to said node;
    said second branch comprising:
        a second PMOS transistor having a first terminal and a second terminal with a channel therebetween, and a gate for controlling the conduction of charges in said channel; said first terminal connected to said first voltage source, said gate connected to said gate of said first PMOS transistor;
        a first NMOS transistor having a first terminal and a second terminal with a channel therebetween, and a gate for controlling the conduction of charges in said channel; said first terminal connected to said gate of said first NMOS transistor and to said second terminal of said second PMOS transistor, said second terminal connected to ground;
        a second NMOS transistor having a first terminal and a second terminal with a channel therebetween, and a gate for controlling the conduction of charges in said channel; said gate of said second NMOS transistor connected to said gate of said first NMOS transistor; said first terminal of said second NMOS transistor connected to said control terminal and said second terminal of said second NMOS transistor connected to ground.

3. The device of claim 1 wherein said memory array comprises an array of floating gate non-volatile memory cells.

4. The device of claim 3 wherein said array of memory cells are arranged in an array accessed by said plurality of rows and columns.

5. The device of claim 4 wherein each memory cell of said memory array is a split gate floating gate non-volatile memory cell.

6. The device of claim 4 wherein each memory cell of said memory array is a stacked gate floating gate non-volatile memory cell.

7. A semiconductor memory device comprising:
    an array of memory cells arranged in a plurality of rows and columns; each cell for storing at least two states: a first state and a second state, wherein the current flow supplied to a memory cell differs for said memory cell storing said first state from said memory cell storing said second state;
    a plurality of rows and columns for accessing said array of memory cells, wherein said columns provide current to said array for storing one of said at least two states;
    said array of memory cells for receiving a plurality of first signals affecting the total amount of current flowing through a first group of columns in said plurality of columns;
    a voltage source having an output;
    a conducting path connecting said output to said first group of columns;
    a current controller in said conducting path for controlling current flow in said conducting path, said controller having a control terminal;
    a first current source having a first terminal and a second terminal, with said first terminal connected to said output and said second terminal connected to said control terminal;
    a second current source connected to a node; said second current source controlled by a plurality of second signals, wherein each second signal is an inverse of a first signal, and wherein said plurality of second signals affect the total amount of current flowing through said second current source at said node; and
    a current mirror circuit having a first terminal and a second terminal, with said first terminal connected to said node and with said second terminal connected to said control terminal, wherein the amount of current flowing through said first terminal is mirrored by the amount of current flowing through said second terminal.

8. The device of claim 7 wherein each of said memory cells is a floating gate non-volatile memory cell.

9. The device of claim 8 wherein each of said memory cells is a split gate floating gate non-volatile memory cell.

10. The device of claim 8 wherein each of said memory cells is a stacked gate floating gate non-volatile memory cell.

11. The device of claim 7 wherein said second current source comprises a plurality of current sources, each controlled by a second signal.

12. The device of claim 7 wherein said current controller is a transistor having a first terminal, a second terminal with a channel therebetween, and a gate for controlling the flow of charges in said channel, said first terminal connected to said output, said second terminal connected to said first group of columns, and said gate being said control terminal.

* * * * *